United States Patent [19]

Kodai

[11] Patent Number: 5,026,452
[45] Date of Patent: Jun. 25, 1991

[54] METHOD OF PRODUCING IC CARDS

[75] Inventor: Syojiro Kodai, Itami, Japan

[73] Assignee: Mitsubishi Denki Kabushiki Kaisha, Japan

[21] Appl. No.: 401,520

[22] Filed: Aug. 31, 1989

Related U.S. Application Data

[63] Continuation of Ser. No. 128,936, Dec. 4, 1987, abandoned.

[30] Foreign Application Priority Data

Dec. 11, 1986 [JP] Japan .............................. 61-296367

[51] Int. Cl.$^5$ ............................................. B32B 31/06
[52] U.S. Cl. .................................... 156/293; 156/295; 283/108; 283/904; 264/276
[58] Field of Search ...................... 156/108, 293, 295; 40/360; 283/107, 108, 904; 264/276

[56] References Cited

U.S. PATENT DOCUMENTS

| | | | |
|---|---|---|---|
| 3,068,140 | 12/1962 | Biddle | 156/293 |
| 3,274,722 | 9/1966 | Kollar et al. | 156/108 |
| 3,702,464 | 11/1972 | Castrucci | 340/173 |
| 3,811,977 | 5/1974 | Kramer | 156/108 |
| 4,174,413 | 11/1983 | Hoppe et al. | 40/630 |
| 4,450,024 | 5/1984 | Haghiri-Tehrani et al. | 156/293 |
| 4,457,798 | 7/1984 | Hoppe et al. | 156/293 |
| 4,624,875 | 11/1986 | Watanabe et al. | 283/904 |
| 4,746,392 | 5/1988 | Hoppe | 156/244.12 |
| 4,879,153 | 11/1989 | Ohashi et al. | 428/137 |

FOREIGN PATENT DOCUMENTS 3131216 4/1982 Fed. Rep. of Germany .

Primary Examiner—Robert A. Dawson
Assistant Examiner—Allan R. Kuhns
Attorney, Agent, or Firm—Leydig, Voit & Mayer

[57] ABSTRACT

A method of producing an IC card in which an IC module is embedded, the method including preparing at least one first resin core sheet having a through hole at a position at which the IC module is to be embedded and at least one second resin core sheet having no hole at a position corresponding to the through hole, disposing adhesive sheet having an area greater than that of the through hole on the first resin core sheet covering the through hole, superposing the first and second resin core sheets with the adhesive sheet therebetween, fitting the IC module into the through hole of the first resin core sheet, heating and pressing the IC module and the resin core sheets to form an integral structure, and applying at least one surface protection sheet to the integral structure to complete the card.

9 Claims, 3 Drawing Sheets

METHOD OF PRODUCING IC CARDS

This application is a continuation of application Ser. No. 128,936 filed Dec. 4, 1987, now abandoned.

BACKGROUND OF THE INVENTION

This invention relates to a method of producing IC cards having IC modules embedded therein or attached thereto and, more particularly, to an improvement in the way in which IC modules are embedded in the body of a card.

FIGS. 1 and 2 show in plan and in section an IC card having an IC module disposed inside its body. As shown in FIGS. 1 and 2, the IC card comprises a card body 1a and IC module 2 embedded therein. In detail, the IC card has the IC module 2, external connection terminals 2a of the IC module 2, an opaque core sheet (resin sheet) 4 having a recess 40 in which the IC module 2 is embedded, transparent surface protection sheets 3 and 5, and an adhesive 6. FIG. 3 shows in section another example of this structure. In this example, the same reference characters are used to indicate components which are identical.

The IC module 2 is embedded in a conventional IC card of this type in such a manner that the recess 40 into which the IC module 2 is fitted is formed in the card body 1a, and the bottom of the IC module 2 is bonded to the bottom of the recess 40 of the card body 1a by the adhesive sheet 6. The card body 1a has uniform thickness overall.

In detail, the card body 1a to which the IC module 2 is attached, is formed of hard polyvinyl chloride sheets, and a design is printed by silk screen printing or offset printing on the surface of the core sheet 4 formed from an opaque sheet which forms the face of the card. The transparent protection sheets 3 and 5 of relatively smaller thicknesses are laid over two surfaces of the core sheet 4 and are integrally connected thereto by heating and pressing, thereby forming the card. There are two methods of making the card: one in which the recess 40 into which the IC module 2 is fitted is formed in the card body and the IC module 2 is mounted in the recess 40 by the adhesive 6 after the card body has been formed; and another in which the recess 40 is formed in the card body, the IC module 2 is mounted in the recess 40 by the adhesive 6, and these members are integrally combined by heating and pressing, thereby forming the IC card.

In the above-described production method, the IC module is bonded to the card body by an adhesive sheet having the same size as the bottom surface of the IC module. In this case, there is no problem if the volume of the recess formed in the card body is equal to the sum of those of the IC module and the adhesive sheet. However, if the volume or depth of the recess of the card body is greater than the corresponding parameters of the module and adhesive sheet, the IC module will not be adequately pressed when it is bonded by heating and pressing. A portion of the card corresponding to the IC module is recessed relative to the surface of the card (refer to FIG. 4A). Even if the card has a flat surface after it is finished, the material of the sheet member of the card body outside the recess partially flows into the recess because of the excessive volume of the recess when it is heated and pressed. Correspondingly, the design printed on the core sheet at the back of the IC module may be displaced locally, resulting in local deformation of the card design. Conversely, if the volume or depth of the recess formed in the card body is smaller than the corresponding parameters of the IC module and the adhesive sheet, then, the IC module will protrude beyond the surface of the card, or the thickness of a card portion at the IC module will be greater than the thickness of other portions, as shown in FIG. 4B. Therefore, this protruding portion is locally pressed at a higher pressure during heating and pressing, the core sheet at the rear of the IC module is locally extruded outward, and the design printed on the core sheet at the back of the IC module is locally deformed, resulting in a poor appearance.

SUMMARY OF THE INVENTION

The present invention has been achieved in consideration of these facts, and an object of the present invention is to provide a method of producing IC cards which is free from the above-described problems and which enables highly reliable bonding construction.

To this end, the present invention provides a method of producing an IC card in which an IC module is embedded, the method including the steps of: preparing at least one first resin sheet having a through hole at a position at which the IC module is embedded and at least one second resin sheet having no hole at a position corresponding to the through hole; disposing an adhesive sheet having an area greater than that of the through hole on the first resin sheet covering the through hole superposing the first and second sheets on each other with said adhesive sheet therebetween; fitting the IC module into the through hole of the first resin sheet; heating and pressing the IC module and all of the sheets to form an integral structure; and applying at least one surface protection sheet to the structure to complete the card.

In accordance with the present invention, in the process of bonding the IC module to the card body, an adhesive sheet having an area greater than that of the through hole is disposed between the sheet in which the through hole is formed and the other sheet having no hole at a position corresponding to the through hole. If the volume of the through hole is greater than that of the IC module, the adhesive sheet melts and flows into the through hole in the card body when it is heated and pressed. Conversely, if the volume of the through hole is smaller than the IC module, the adhesive sheet flows over a wide area between the sheet in which the through hole is formed and the other sheet having no hole at a position corresponding to the through hole. The difference between the volumes of the through hole of the card body and the IC module is thereby absorbed so that any local deformation of the sheet member at the back of the IC module can be prevented.

DESCRIPTION OF THE PREFERRED EMBODIMENT

Figure 1:
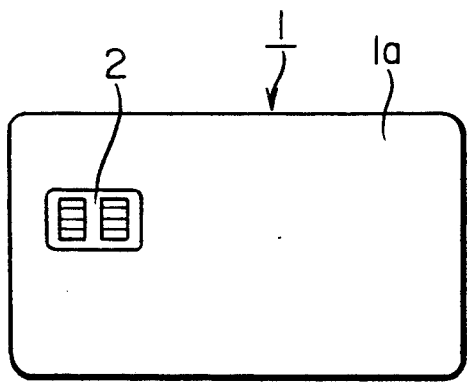
FIG. 1 is a plan view of a conventional IC card.
Figure 2:
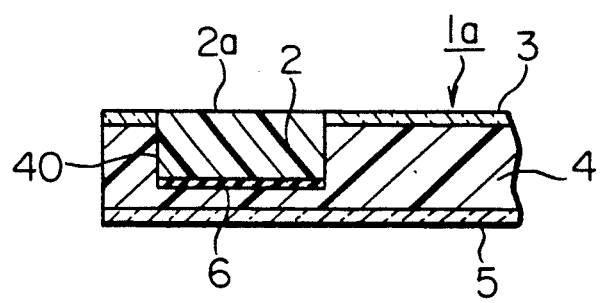
FIG. 2 is a cross-sectional view of the structure of the conventional IC card shown in FIG. 1.
Figure 3:
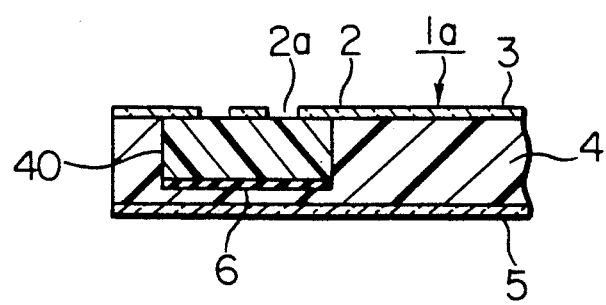
FIG. 3 is a cross-sectional view of another example of a structure of a conventional IC card.
Figure 4A:
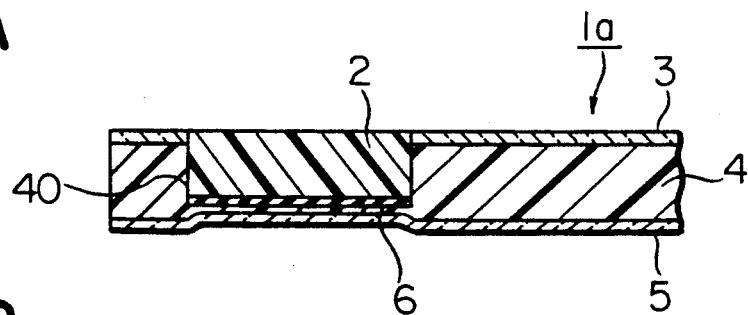
FIG. 4A is a cross-sectional view of a conventional method of producing IC cards in which the volume of a recess is excessive.
Figure 4B:
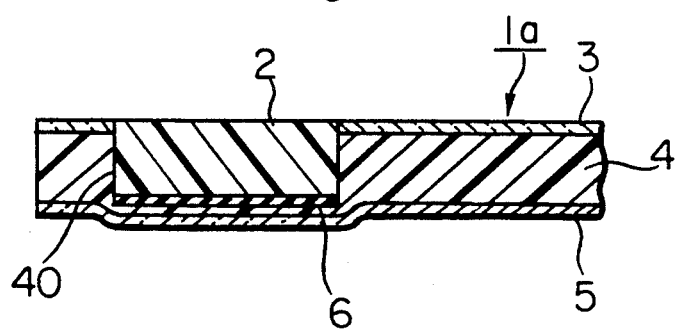
FIG. 4B is a cross-sectional view of a case of the conventional method of producing IC cards in which the volume of the recess is insufficient.
Figure 5:
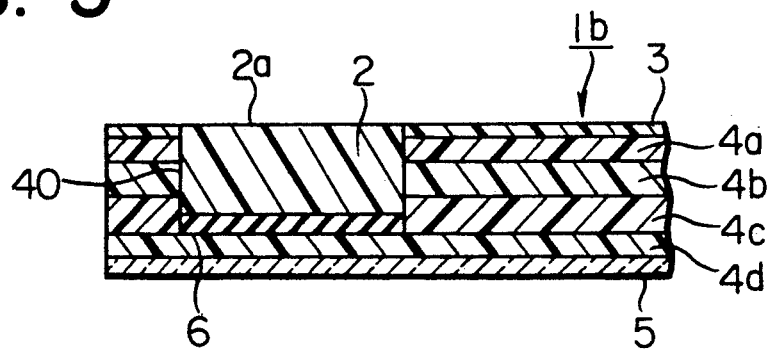
FIG. 5 is a cross-sectional view of the structure of an IC card which represents an embodiment of the present invention.
Figure 6:
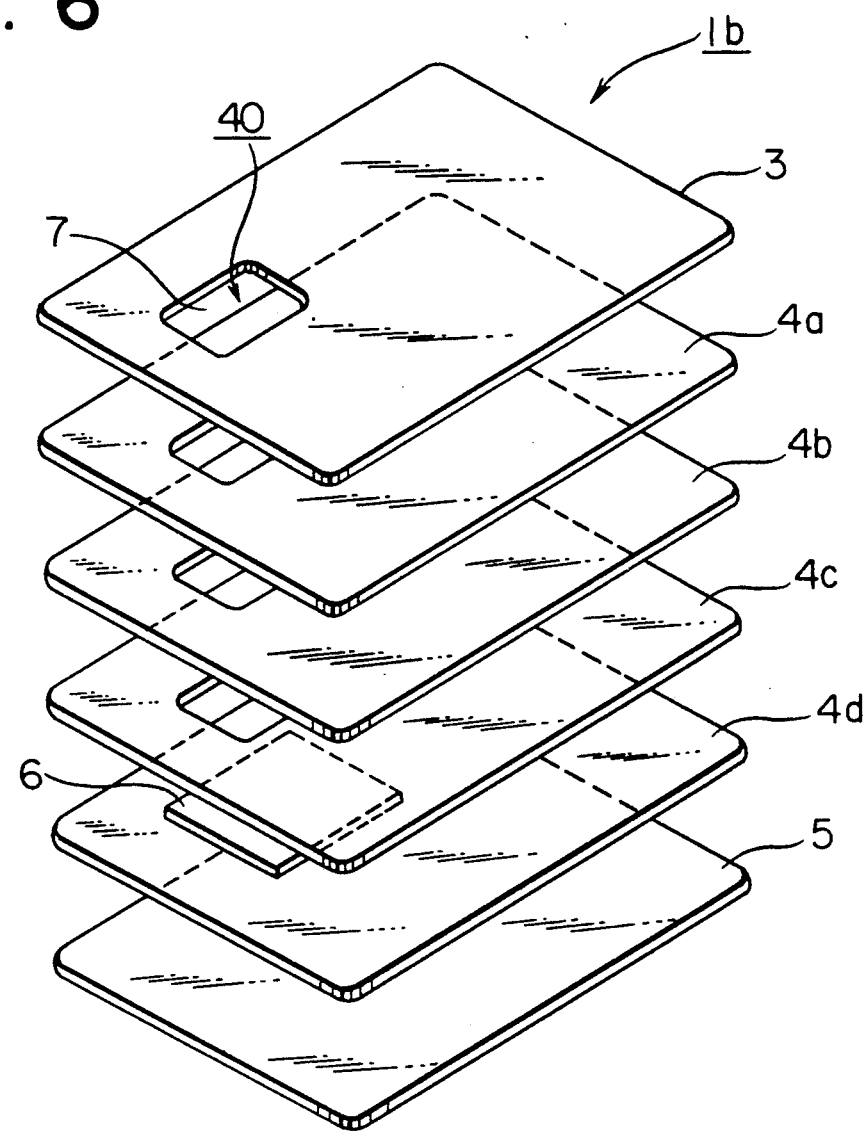
FIG. 6 is an exploded perspective view of the IC card shown in FIG. 5.

A preferred embodiment of the present invention will be described with reference to the accompanying drawings. FIG. 5 shows in section the structure of an IC card in accordance with the present invention. As shown in FIG. 5, the card body 1b of the card has a multilayer structure formed of hard polyvinyl chloride sheets, that is, it has six layers consisting of two transparent surface protection layers 3 and 5, and four opaque core layers 4a to 4d. The structure of FIG. 5 is also shown in FIG. 6 in an exploded perspective view. The structure includes an adhesive sheet 6 and through holes 7 which are formed in sheets 3, and 4a to 4c and which are aligned to form a recess 40 into which an IC module 2 is fitted.

Figure 7:
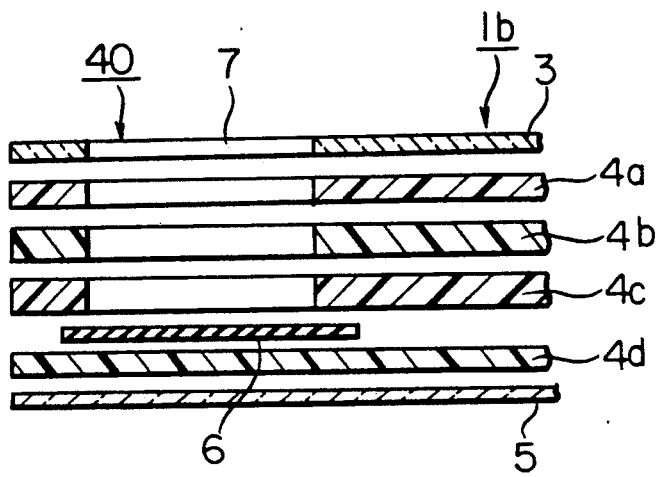
FIG. 7 is an exploded sectional view illustrating a method of producing IC cards in accordance with the present invention.

Next, a method of producing the IC card in accordance with the present invention will be described. The through holes 7, in which the IC module 2 is fitted, are formed in the sheet 3 corresponding to the first layer and in the sheets 4a to 4c corresponding to the second to fourth layers at a position at which the IC module 2 is to be incorporated in the IC card. The sheets 3, and 4a to 4c in which the through holes 7 are formed, the adhesive sheet 6 having an area greater than that of the through holes 7, sheets 4d and 5 which have no holes at a position corresponding to that of the through holes 7 and which correspond to the fifth and sixth layers are thereafter superposed on each other in this order, as shown in FIG. 7. The adhesive sheet 6 is a polyester hot melt sheet which has a thickness of 30 μm and which is larger than the through holes 7 by 5 mm around the entire periphery, of hole 7. The adhesive sheet 6 is disposed between the sheet 4c which forms the fourth layer and the sheet 4d which forms the fifth layer 5 so that the center of the adhesive sheet 6 coincides with the center of the through holes 7. The IC module 2 is fitted into the through holes 7 of the superposed sheets in such a manner that external connection terminals of the IC module 2 coincide with an external surface of the card. The members thereby assembled are integrally bonded by heating and pressing at a temperature of 130° C. for 5 minutes.

Figure 8A:
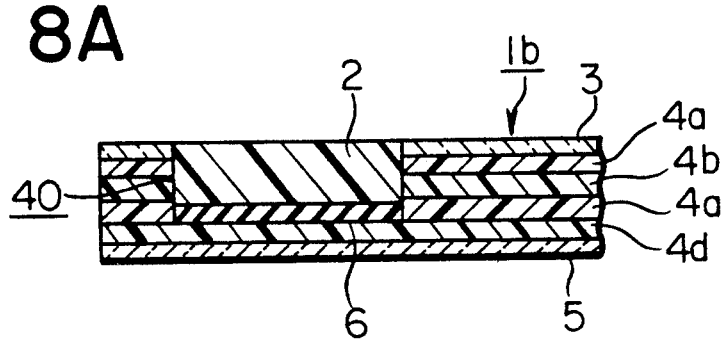
FIG. 8A is a cross-sectional view of a method of producing IC cards in accordance with the present invention in which the volume of a through hole is excessive.
Figure 8B:
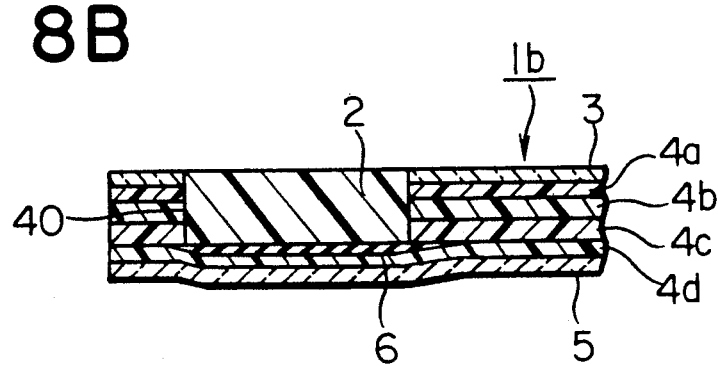
FIG. 8B is a cross-sectional view of a method of producing IC cards in accordance with the present invention in which the volume of the through hole is insufficient.

In accordance with this embodiment, the difference between the volumes of the recess 40 the card body 1b and the IC module 2 is absorbed by the adhesive sheet layer 6. Layer 6 has an area greater than that of the through holes 7, as shown in FIGS. 8A and 8B, thereby eliminating the possibility of local deformation of the core sheet at the back of the IC module. That is, if, as shown in FIG. 8A, the volume or thickness of the IC module 2 is smaller than the corresponding parameter of the recess 40 formed of the through holes 7, the material of the adhesive sheet 6 flows, by heating and pressing, into the area on a sheet portion to which the IC module is bonded (below the IC module). If, as shown in FIG. 8B, the volume or thickness of the IC module is greater than the corresponding parameter of the recess 40, the material of the adhesive sheet 6 spreads out between the core sheets 4c and 4d.

In the conventional method, the adhesive sheet is as large as the bottom surface of the IC module and fitted in the gap between the IC module and the card body, and it is not possible to ascertain whether or not the adhesive sheet has been fitted completely. In contrast, in the present invention, an adhesive sheet having an area greater than that of the through hole is used, the sheets of material are superposed on each other after the adhesive sheet has been temporarily attached to one of the sheets from below the through hole, and the IC module is thereafter mounted. It is thereby possible to mount the IC module after inspecting to see whether or not the adhesive sheet has been bent or creased. Therefore, the workability of this process can be facilitated and the IC module can be positively bonded to the card body.

The above embodiment makes use of a heat-sensitive adhesive sheet, but any type of adhesive sheet is applicable so long as it can be easily deformed during heating and pressing. A thermosetting adhesive sheet in a semi-hardened state B stage can, of course, be used.

In the above embodiment, the card body is formed of six layers (except for the adhesive sheet). However, the invention is not specifically limited to this structure. Any other type of structure is possible so long as it includes more than two layers, a sheet having a through hole and a sheet having no through hole and disposed below the former so as to support the bottom of the IC module. Accordingly, the surface protection sheet may be applied to one or both of the two surfaces of the card body as desired.

As described above, the present invention provides a method in which the card body is formed of one or more core sheets each having a through hole in which the IC module is fitted, and another core sheet disposed thereunder for supporting the bottom of the IC module, and in which an adhesive sheet having an area greater than that of the through hole is interposed between the core sheet having the through hole and the core sheet that supports the bottom of the IC module in such a manner that the center of the adhesive sheet coincides with that of the through hole, thereby bonding the IC module to the card body. This method can prevent any local deformation of the sheet members of the card due to a difference between the volume of the IC module and the volume of a recess into which the IC module is fitted and, hence, any deformation of the outside design. THis method thus improve the workability and reliability of the IC card.

What is claimed is:

1. A method of making a card in which an IC module is embedded comprising:
    preparing at least two similar resin core sheets by forming a through hole in at least a first of said resin core sheets in which an IC module may be disposed, at least a second of said resin core sheets not containing a through hole;
    disposing a thermally softenable adhesive sheet having an area that is smaller than that of said core sheets and larger than that of said through hole and having a shape that covers said through hole to cover said through hole in said first resin core sheet;

bringing said first and second resin core sheets into contact with each other with said adhesive sheet therebetween covering said through hole;

inserting an IC module into said through hole;

heating said resin core sheets and said adhesive sheet to soften said adhesive sheet and pressing said resin core sheets, said adhesive sheet, and said IC module so that said softened adhesive sheet flows between said first and second core sheets toward the through hole to fill voids, if any, between the through hole and said IC module and away from the through hole to form an integral structure;

applying at least one surface protection sheet to a side of said integral structure; and heating and pressing said protection sheet and said integral structure to adhere said surface protection sheet to said integrated structure.

2. The method of making a card according to claim 1 including a plurality of said first resin core sheets, each having a through hole in which said IC module is to be disposed, including aligning the through holes in said plurality of first resin core sheets to form a recess for receiving said IC module wherein the adhesive sheet flows between the second core sheet and the adjacent first core sheet.

3. The method of making a card according to claim 1 including applying a surface protection sheet to each side of said integral structure and heating and pressing said protection sheets and said integral structure to complete said card.

4. The method of making a card according to claim 1 wherein said at least one protection sheet includes a through hole and including aligning said through hole in said protection sheet with said through hole in said first resin core sheet before heating and pressing said protection sheet and said integral structure.

5. The method of making a card according to claim 1, wherein said adhesive sheet is a heat-sensitive adhesive sheet.

6. The method of making a card according to claim 1, wherein said adhesive sheet is thermosetting adhesive sheet in a semi-hardened state.

7. The method of making a card according to claim 1 comprising, before said step of superposing said at least one surface protection sheet, printing a design on the side of said resin core sheet where said surface protection sheet is to be applied.

8. The method of making a card according to claim 7 wherein said adhesive sheet is a heat-sensitive adhesive sheet.

9. The method of making a card according to claim 7 wherein said adhesive sheet is a thermosetting adhesive sheet in a semi-hardened state.

* * * * *